(12) United States Patent  (10) Patent No.: US 8,660,829 B2
Russell  (45) Date of Patent: Feb. 25, 2014

(54) MACHINE EMULATOR MACHINES

(75) Inventor: Matthew Alan Russell, Monroe, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 219 days.

(21) Appl. No.: 13/230,930

(22) Filed: Sep. 13, 2011

(65) Prior Publication Data

US 2013/0066620 A1   Mar. 14, 2013

(51) Int. Cl.
*G06G 7/48* (2006.01)
*G06F 17/50* (2006.01)

(52) U.S. Cl.
CPC .................................. *G06F 17/5018* (2013.01)
USPC .................................................. 703/7; 703/6

(58) Field of Classification Search
USPC ............ 703/2, 6, 7; 345/419–420; 700/97–98
See application file for complete search history.

(56) References Cited

U.S. PATENT DOCUMENTS

| | | | |
|---|---|---|---|
| 4,551,806 A | 11/1985 | Storace et al. | |
| 5,771,043 A | 6/1998 | Nigawara et al. | |
| 6,033,226 A | 3/2000 | Bullen | |
| 6,106,297 A | 8/2000 | Pollak et al. | |
| 6,282,455 B1 | 8/2001 | Engdahl | |
| 6,296,486 B1 | 10/2001 | Cardaillac et al. | |
| 6,477,437 B1 | 11/2002 | Hirota | |
| 6,671,571 B1 * | 12/2003 | Matsumiya et al. | 700/172 |
| 6,718,215 B2 | 4/2004 | Friedrich et al. | |
| 6,788,987 B2 | 9/2004 | Slechta et al. | |
| 6,875,019 B2 | 4/2005 | Huang et al. | |
| 6,892,358 B2 | 5/2005 | Draghett et al. | |
| 7,039,632 B2 | 5/2006 | McCormick | |
| 7,054,793 B2 | 5/2006 | Moritz et al. | |
| 7,392,486 B1 | 6/2008 | Gyde et al. | |
| 7,392,691 B1 | 7/2008 | Yeckley | |
| 7,490,029 B2 | 2/2009 | Wasynczuk et al. | |
| 7,583,275 B2 | 9/2009 | Neumann et al. | |
| 2004/0091845 A1 | 5/2004 | Azerad et al. | |
| 2006/0217831 A1 | 9/2006 | Butterworth et al. | |
| 2008/0269596 A1 * | 10/2008 | Revie et al. | 600/424 |

(Continued)

FOREIGN PATENT DOCUMENTS

WO   WO 2006/003198   1/2006
WO   WO 2009/080296   7/2009

OTHER PUBLICATIONS

Wei et. al., "A Simulator of Winding Machine Controller using LabView Environment", 2004 IEEE. p. 2105, 2110.*

*Primary Examiner* — Eunhee Kim
(74) *Attorney, Agent, or Firm* — Peter D. Meyer

(57) ABSTRACT

Emulator computer program machines including an emulator module are disclosed. A machine includes a computer usable medium having computer readable program code for emulating a process of a machine having actuators and mechanical elements. The computer readable program code includes computer readable code instructions configured to display a graphical user interface having input fields corresponding to the actuators and mechanical elements, and to display a graphical representation of output response data of the machine using inputted parameters. Computer readable code instructions for receiving a plurality of parameters inputted into the plurality of input fields, and for emulating a mechanical operation of the machine using the plurality of parameters inputted into the plurality of input fields by simulating the programmable logic controller code are included. Output response data based on an emulation of the mechanical operation of the machine is generated and displayed.

10 Claims, 15 Drawing Sheets

(56) References Cited

U.S. PATENT DOCUMENTS

| | | |
|---|---|---|
| 2009/0089700 A1 | 4/2009 | Gu et al. |
| 2009/0281779 A1 | 11/2009 | Kajitani et al. |
| 2010/0057220 A1* | 3/2010 | Araki ................................ 700/7 |
| 2010/0082125 A1 | 4/2010 | Pingel et al. |
| 2010/0125790 A1 | 5/2010 | Erskin |
| 2010/0168874 A1* | 7/2010 | Lucas et al. ..................... 700/17 |
| 2010/0241244 A1* | 9/2010 | Bliss et al. ...................... 700/18 |

* cited by examiner

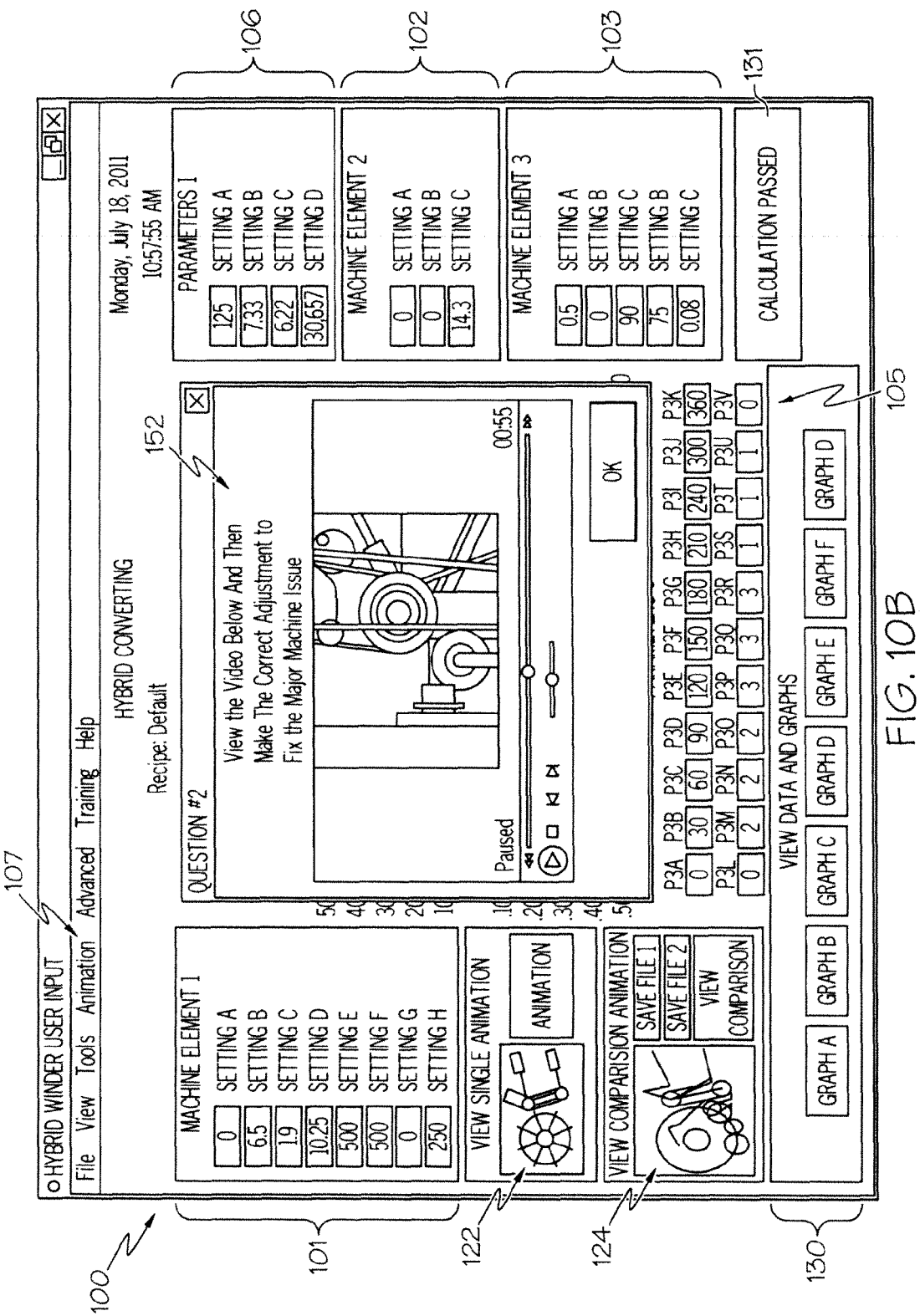

MACHINE EMULATOR MACHINES

TECHNICAL FIELD

The present application relates generally to machine emulation and, more particularly, machine emulator machines comprising an emulator that mimic programmable logic controller code of a programmable logic controller to produce output response data that emulates a machine.

BACKGROUND

Machines and systems used to fabricate products, such as consumer goods products, for example, often use programmable logic controllers to control the various actuators of the machine. Programmable logic controllers are programmed with programmable logic controller code to generate drive signals for the various actuators in accordance with a desired sequence to fabricate the products.

A designer or operator of the machine may be required to make modifications to the programmable logic controller code for many reasons. For example, there may be a change to the specifications to the product that necessitates a change to the programmable logic controller code. A new product may require changes to the programmable logic controller code. Additionally, changes to the machine used to fabricate the product may require updating the programmable logic controller code.

Modifying the programmable logic controller code may be time consuming for the designer or operator. In many cases, changes are made to the programmable logic controller code is accomplished by trial and error. Changes are made and then observation of the machine with the code changes is performed. However, such an iterative process may be time consuming and create down-time for the machine.

Accordingly, alternative emulators, emulation methods and machines including an emulator module that mimic programmable logic controller code and emulate a process of a machine without requiring a user to program an actual programmable logic controller are desired.

SUMMARY

According to another embodiment, a machine includes a plurality of actuators, a plurality of mechanical elements, wherein individual ones of the plurality of mechanical elements are coupled to individual ones of the plurality of actuators such that the plurality of actuators move the plurality of mechanical elements, and a human machine interface having a machine graphics display device, the human machine interface configured to accept input parameters. The machine graphics display device is operable to display the input parameters and output data. The machine further includes a programmable logic controller including a machine computer usable medium having programmable logic controller code embodied thereon, wherein the programmable logic controller is communicatively coupled to the human machine interface, and the programmable logic controller code comprises computer readable code instructions configured to receive input parameters from the human machine interface and provide output signals to the plurality of actuators in accordance with the received input parameters. The machine also includes a computer device including a processor and a computer usable medium having computer readable program code embodied on the computer usable medium for emulating a process of the machine. The computer readable program code includes computer readable code instructions configured to display a graphical user interface comprising a plurality of input fields corresponding to the plurality of actuators and the plurality of mechanical elements, and a graphical representation of output response data of the machine using inputted parameters, computer readable code instructions for receiving a plurality of parameters inputted into the plurality of input fields, wherein the plurality of parameters are associated with the plurality of actuators and the plurality of mechanical elements, and computer readable code instructions for emulating a mechanical operation of the machine using the plurality of parameters inputted into the plurality of input fields by simulating the programmable logic controller code, and generating the output response data based on an emulation of the mechanical operation of the machine. The computer readable code program also includes computer readable code instructions for converting the output response data into the graphical representation of output response data for display within the graphical user interface.

BRIEF DESCRIPTION OF THE DRAWINGS

FIGS. 10A and 10B schematically depict a graphical user interface of an emulator computer program product for presenting training scenarios to a user according to one or more embodiments illustrated and described herein.

DETAILED DESCRIPTION OF THE INVENTION

Figure 1:
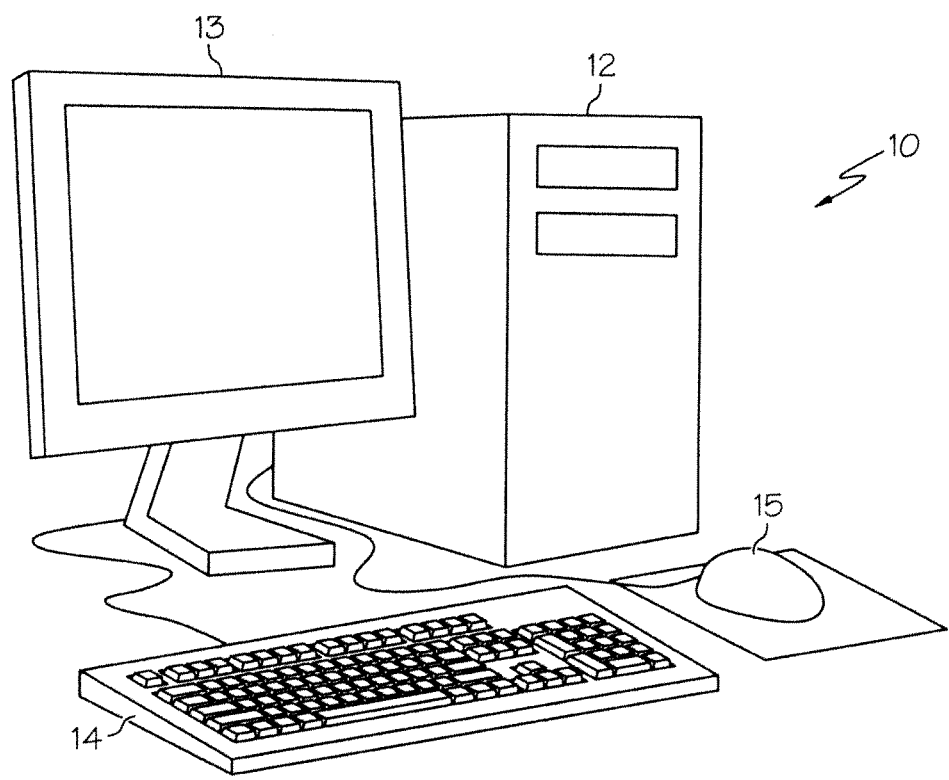
FIG. 1 schematically depicts a computer system for emulating a machine according to one or more embodiments illustrated and described herein.

Embodiments disclosed herein are generally related to computer program products, systems, and methods for emulating a machine of a manufacturing process. Generally, the embodiments described herein may comprise an emulator model that utilizes a calculation routine that emulates programmable logic controller code used by a programmable logic controller provided as a component of the machine to control various actuators of the machine. As used herein, the phrase "programmable logic controller" encompasses traditional programmable logic controllers as well as microcontrollers, application specific integrated circuits (ASIC), and the like, that may be utilized in embedded systems. Further, the phrase "programmable logic controller code" as used herein means program code that is executed by a programmable logic controller, microcontroller, ASIC, or the like. The calculation routine may use geometric information regarding the various mechanical elements of the machine (e.g., mandrels, rods, turrets, etc.) and actuators (e.g., servo motors, pneumatic cylinders, hydraulic cylinders, linear actuators, etc.) to produce output response data, such as servo drive positioning tables, for example. In one embodiment, an animation of the machine process based upon user-inputted parameters is provided.

The embodiments described herein may be used by an operator of the emulated machine for training purposes. For example, the computer program product may be installed on a computer device that the operator may use to enter various parameters to determine the effect of such parameters without actually programming the programmable logic controller and perhaps causing damage to the products being manufactured and/or the machine. Further, in one embodiment, training scenarios are presented to a user that requests the user to make adjustments to the parameters in accordance with the training scenarios.

As described in detail below, embodiments may be used on a computer device as well as on the actual human machine interface of the machine being emulated. For example, an operator of a machine may switch between the actual human machine interface used to control the machine and the emulator graphical user interface. The emulator model may be linked with a product model and/or a process model to share parameter values therebetween. Various embodiments of the computer program products, methods, and systems for emulating a process of a machine are described in detail below.

Although embodiments are described herein in the context of a winder machine for winding a continuous web material onto rolls (e.g., paper towels), embodiments may be used to model any machine and/or process. As non-limiting examples, embodiments may be used to emulate a diaper manufacturing process, a shoe manufacturing process, and the like. An exemplary winder machine for which the embodiments described herein may emulate is described in U.S. Pat. No. 7,392,961. Embodiments described herein may also be utilized in other industrial processes, such as the processes of spraying, gluing, and the manufacture of liquid/powder products, such as detergent. Although embodiments described herein emulate mechanical elements and mechanical actuation, embodiments may also be used to emulate flow rates of fluid (e.g., based on nozzle configuration, fluid lines, etc.), fluid patterns and boundary layers, etc.

Referring now to the drawings, FIG. 1 depicts an exemplary computer system 10 on which a computer program product in accordance with the embodiments described herein may be installed. The computer system 10 may comprise a computer device 12, a graphics display device 13, and input devices, such as a keyboard 14 and a mouse 15. It should be understood that while the computer system 10 is depicted as a personal computer system, this is a non-limiting example. More specifically, in some embodiments any type of computing device (e.g., smart phone, tablet computer, laptop computer, media player, server, specialized computer, etc.) may be utilized. As described in detail below, machine emulator computer program code may be installed on the computer device 12 such that a user may input parameters into the graphical user interface to emulate machine processes.

Figure 2:
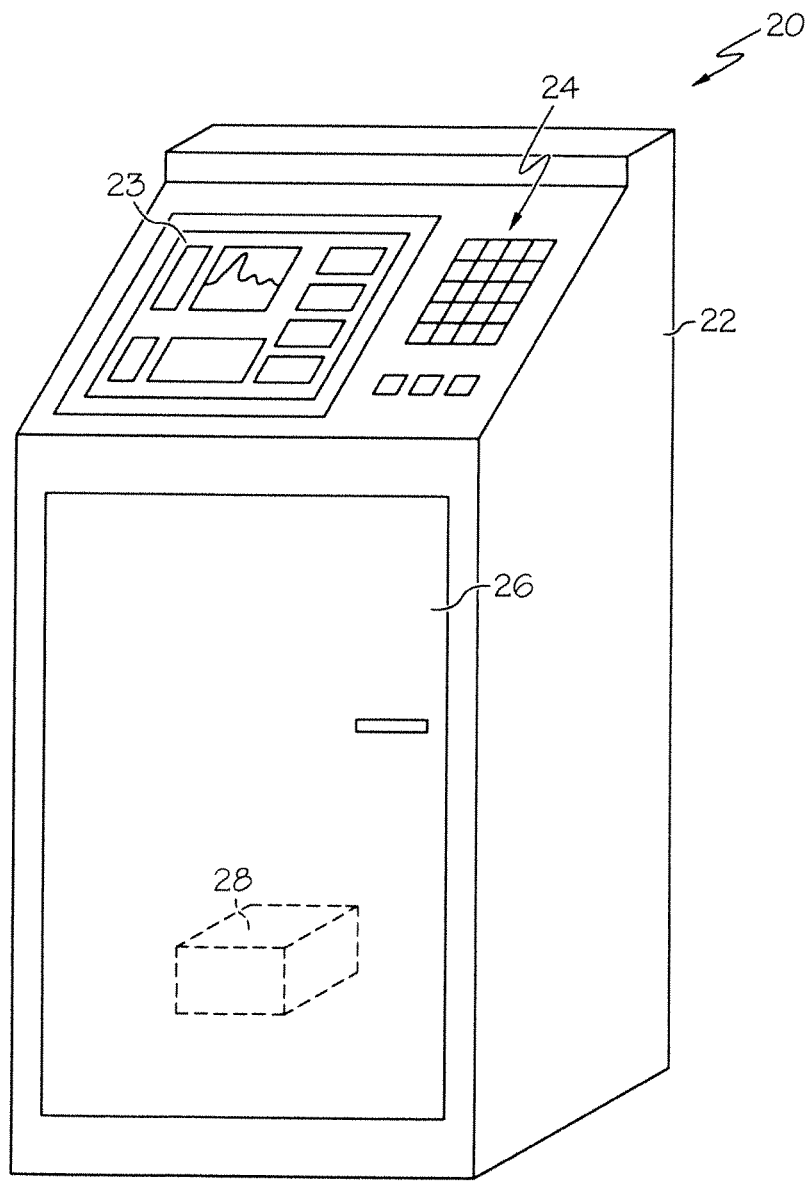
FIG. 2 schematically depicts a human machine interface of a machine according to one or more embodiments illustrated and described herein.

Referring now to FIG. 2, an exemplary human machine interface 20 a machine is depicted, wherein the human machine interface 20 is configured as an operator terminal An operator of a machine, such as a winder machine, may use the human machine interface unit to interact with, program, and otherwise control the machine. The human machine interface 20 of the illustrated embodiment comprises a machine graphics display device 23 and user input elements 24 (e.g., a keyboard and other buttons) built into a human machine interface cabinet 22. The human machine interface 20 may enclose a programmable logic controller 28 and other hardware components, such as a processor and memory (see FIG. 3). The human machine interface 20 may have a door 26 to provide access to the electrical components maintained therein. The programmable logic controller may be electrically coupled to a plurality of actuators associated with the machine, and may be programmed to provide output signals such that each of actuators move in accordance with programmable logic controller code logic, which may be stored on a machine computer usable medium (i.e., a memory component) within the programmable logic controller. It should be understood that the human machine interface 20 may take on a variety of configurations, and that embodiments of the present disclosure are not limited to the configuration of the human machine interface 20 depicted in FIG. 2. As an example and not a limitation, the human machine user interface may be configured as a tablet or pendant that the operator may hold in his or her hands.

Figure 3:
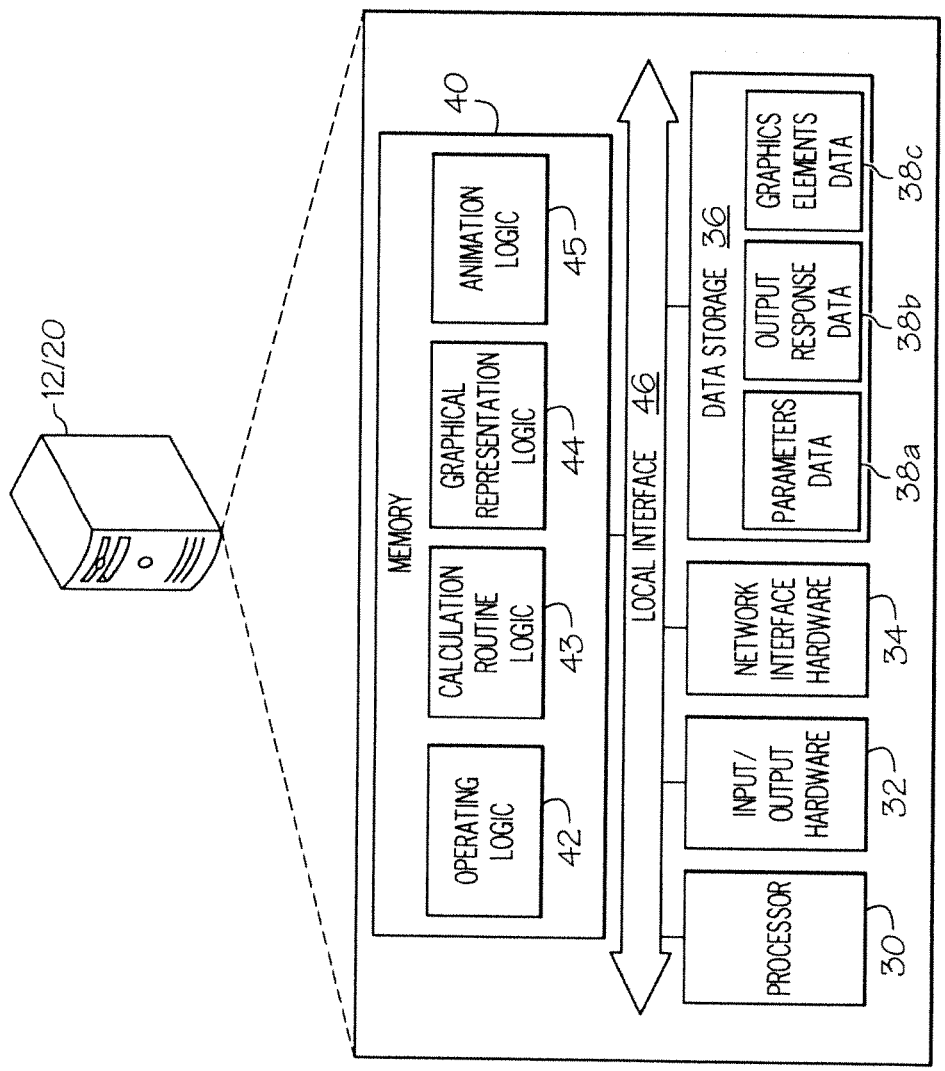
FIG. 3 schematically depicts internal components of the computer system depicted in FIG. 1 or the human machine interface depicted in FIG. 2 according to one or more embodiments illustrated and described herein.

FIG. 3 depicts internal components of the computer device 12 or the human machine interface 20 depicted in FIGS. 1 and 2, respectively, further illustrating a system for emulating a process of a machine, and/or a non-transitory computer usable medium having a computer program product comprising computer readable code instructions for emulation of a machine as hardware, software, and/or firmware, according to embodiments shown and described herein.

As also illustrated in FIG. 3, the computer device 12 or the human machine interface 20 may include a processor 30, input/output hardware 32, network interface hardware 34, a data storage component 36 (which may store parameters data 38a, output response data 38b, and graphics element data 38c, described below), and a non-transitory memory component 40. The memory component 40 and data storage component may be configured as volatile and/or nonvolatile computer readable medium and, as such, may include random access memory (including SRAM, DRAM, and/or other types of random access memory), flash memory, registers, magnetic disks, compact discs (CD), digital versatile discs (DVD), and/or other types of storage components. Additionally, the memory component 40 may be configured to store operating logic 42, calculation routine logic 43, graphical representation logic 44, and animation logic 45 (each of which may be embodied as computer readable program code instructions, firmware, or hardware, as an example). A local interface 46 is also included in FIG. 3 and may be implemented as a bus or other interface to facilitate communication among the components of the computer device 12 or the human machine interface 20.

The processor 30 may include any processing component configured to receive and execute computer readable code instructions (such as from the data storage component 36 and/or memory component 40). The input/output hardware 32 may be configured to receive signals from user input and output devices such as a graphical display device, a keyboard, a mouse, a printer, a camera, a microphone, a speaker, a touch-screen, and/or other device for receiving, sending, and/ or presenting data. In some embodiments, the computer device 12 or the human machine interface 20 may be connected to a network via the network interface hardware 34. The network interface hardware 34 may include any wired or wireless networking hardware, such as a modem, LAN port, wireless fidelity (Wi-Fi) card, WiMax card, mobile communications hardware, and/or other hardware for communicating with other networks and/or devices.

It should be understood that the data storage component 36 may reside local to and/or remote from the computer device 12 or human machine interface 20, and may be configured to store one or more pieces of data. As illustrated in FIG. 3, the data storage component 36 may store parameters data 38$a$, which in at least one embodiment includes a plurality of parameters entered into a graphical user interface by a user or an operator. The parameters may define operational and mechanical characteristics of mechanical elements and actuators of the machine. Similarly, output response data 38$b$ may be stored by the data storage component 36 and may include output response data resulting from previous emulation sessions executed by the calculation routine logic 43. Graphics element data 38$c$ used to generate animations of the machine process (e.g., computer graphics associated with each of the parts of the emulated machined, such as a mandrel, a belt, a turret, etc.) may also be stored in the data storage component 36.

Included in the memory component 40 may be the operating logic 42, the calculation routine logic 43, the graphical representation logic 44, and the animation logic 45. The operating logic 42 may include an operating system and/or other software for managing components of the server computing device 12$b$. The operating logic 42 may also include computer readable program code for displaying the graphical user interface described herein. Similarly, the calculation routine logic 43 may reside in the memory component 40 and may be configured to mimic the programmable logic controller code used to control the machine, and produce corresponding output response data of the plurality of mechanical elements and the plurality of actuators of the machine. The graphical representation logic 44 may be configured to receive the output response data generated by the calculation routine logic 43 and generate a graphical representation of output response data, such as graphs and tables, for example. The animation logic 45 may be configured to create one or more animations of a machine process based on the output response data generated by the calculation routine logic 43. In an alternative embodiment, the memory component 40 and the data storage component 36 are the same element such that the operating logic 42, the calculation routine logic 43, the graphical representation logic 44, the animation logic 45, the parameters data 38$a$, the output response data 38$b$, and the graphics element data 38$c$ are all stored on the same physical memory device.

It should be understood that the components illustrated in FIG. 3 are merely exemplary and are not intended to limit the scope of this disclosure. More specifically, while the components in FIG. 3 are illustrated as residing within the computer device 12 or the human machine interface 20, this is a non-limiting example. In some embodiments, one or more of the components may reside external to the computer device 12 or the human machine interface 20.

Figure 7A:
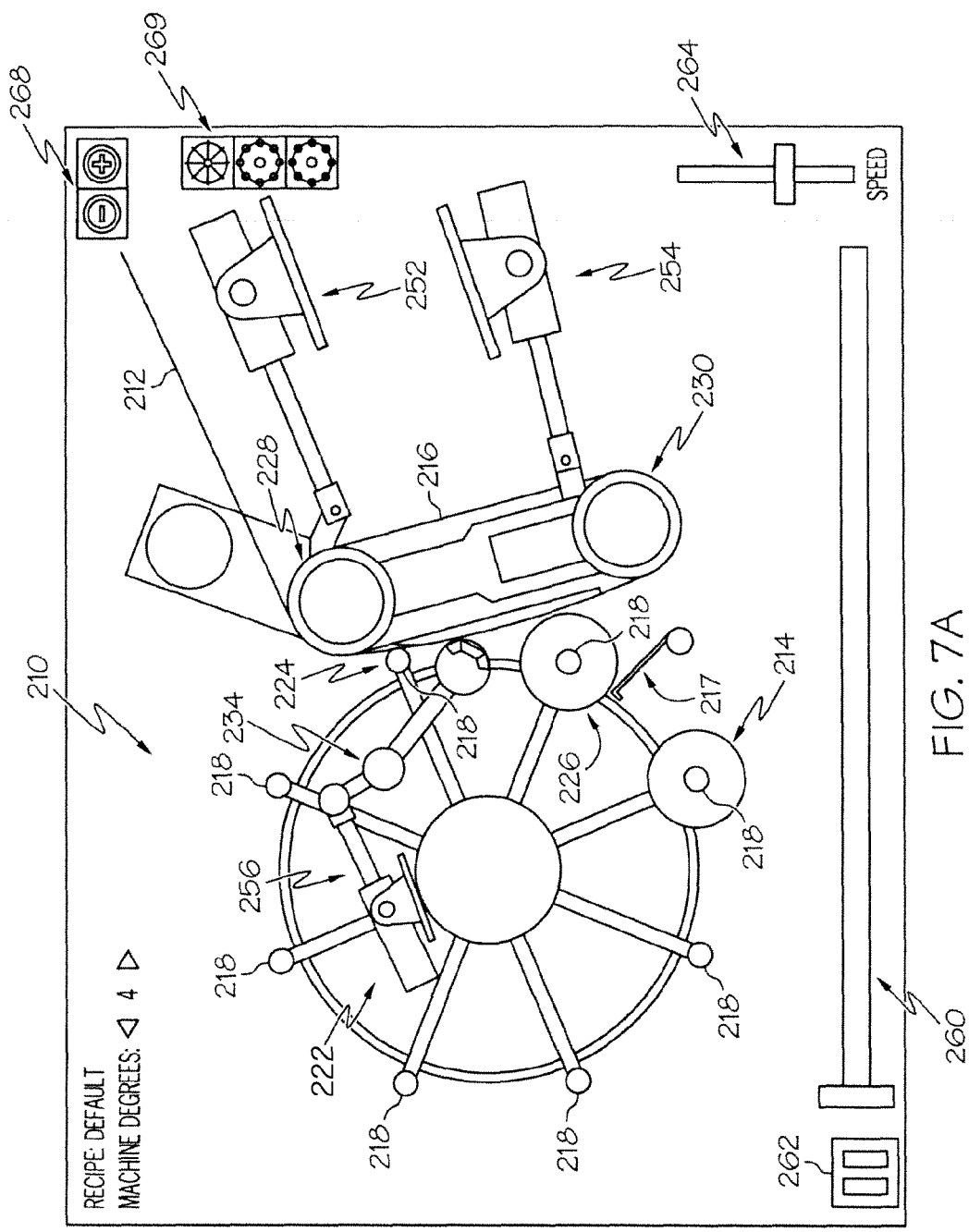
FIGS. 7A and 7B depict a screen shot of a machine animation resulting from output response data according to one or more embodiments illustrated and described herein.

As described above, embodiments of the present disclosure are directed to emulation of a machine and machine process using a graphical user interface wherein the user may enter machine parameters into the graphical user interface and the emulator module will produce output response data corresponding with the parameters entered by the user. As used herein, the phrase "graphical user interface" means any type of interface using a screen or monitor that presents information to a user and allows a user to input information. Graphical user interfaces may include, but are not limited to, traditional graphical user interfaces (such as interactive windows), tables, and command line interfaces, such as DOS prompts. Referring to FIG. 7A, a screen shot of an animation of a hybrid winder machine 210 provided by an emulation model of one embodiment is illustrated. A winder or reel is typically known as a device that performs the very first wind of the continuous web material, generally forming what is known as a parent roll. A rewinder, on the other hand, is generally known as a device that winds the continuous web material from the parent roll into a roll that is essentially the finished product. For purposes of the present application, the words "winder" and "rewinder" are interchangeable with one another.

As shown in FIG. 7A, a hybrid winder machine 210 of the exemplary animation generally comprises a turret 222 supporting a plurality of winding spindles 218 and a conveyor belt having a first conveyor roller 228 and a second conveyor roller 230. The hybrid winder machine 210 may be suitable for use in winding a continuous web material 212 to produce a final wound product 214. As an example and not a limitation, the continuous web material 212 may be transported by the conveyor belt 216 into winding contact with at least one winding spindle 218. In one embodiment, a plurality of winding spindles 218 are disposed upon a winding turret 222 indexable about a center shaft thereby defining a winding turret axis. The winding turret 222 is preferably indexable, or moveable, through an endless series of indexed positions. For example, a first winding spindle 224 can be located in what may be conveniently called an initial transfer position and a second winding spindle 226 can be located in what may conveniently be called a final wind position. In any regard, the winding turret 222 may be indexable from a first index position into a second index position. Thus, the first winding spindle 224 may be moved from the initial transfer position into the final wind position. Such indexable movement of the first winding spindle 224 disposed upon winding turret 222 may comprise a plurality of discrete, defined positions or a continuous, non-discrete sequence of positions. However, it should be appreciated that winding spindle 218 can be brought into proximate contact with conveyor belt 216 by any means known to one of skill in the art.

In one embodiment, the conveyor belt 216 is driven at a surface speed that corresponds to the speed of the incoming continuous web material 212. A positioning device(s), such as first positioning actuator 252 and second positioning actuator 254 (e.g., linear actuators, servo motors, cams, links, and the like known by those of skill in the art), are provided for control of the position of first conveyor roller 228 and second conveyor roller 230 supporting conveyor belt 216. Thus, first positioning actuator 552 associated with first conveyor roller 228 may be capable of moving first conveyor roller 228 along a first axis. In such an embodiment, the first axis is generally parallel to the Z-direction relative to continuous web material 212 as web material 212 passes proximate to a winding spindle 218. Likewise, second positioning actuator 254 associated with second conveyor roller 230 may be capable of adjusting the position of second conveyor roller 230 along a second axis. In such an embodiment, the second axis is generally parallel to the Z-direction relative to web material 212 as web material 212 passes proximate to a winding spindle 218. The position of first conveyor roller 228 and second conveyor roller 230, when combined with the known diameter growth of the log associated with second winding spindle 226, can provide the desired contact, clearance, and/or pressure between the conveyor belt 216 and the log associated with second winding spindle 226.

As mentioned above, the winding spindles 218 may engage a core (not shown) upon which the web material 212 is wound. The winding spindles 218 are driven in a closed spindle path about the winding turret 222 assembly central axis. Each winding spindle 218 extends along a winding spindle 218 axis generally parallel to the winding turret 222 assembly winding turret axis, from a first winding spindle 218 end to a second winding spindle 218 end. The winding spindles 218 may be supported at their first ends by the winding turret 222 assembly. The winding spindles 218 may be releasably supported at their second ends by a mandrel cupping assembly (not shown).

Once the desired number of sheets of web material 212 has been wound into a log associated with second winding spindle 226, a web separator 234 can be moved into position proximate to web material 212 disposed upon conveyor belt 216 in order to provide separation of adjacent sheets of perforated web material 212. The web separator 234 can be provided as a rotary unit sharing apparatus known to those of skill in the art useful for the severance of the web material 212 into individual sheets. In one embodiment, the web separator 234 cooperates with the surface of conveyor belt 216 upon which web material 212 is disposed. The web separator 234 may be provided as a continuous speed roll moved intermittently and/or periodically into contact with the web material 212 disposed upon conveyor belt 216. The movement of the web separator 234 may be timed such that the web separator 234 nips the web material 212 against the conveyor belt 216 when the perforation at the trailing end of the last desired sheet for the log associated with second winding spindle 226 is located between the first, or new, winding spindle 224 at the transfer position (i.e., at the web material 212 nip point) and the web separator 234 surface when it contacts the conveyor belt 216. Element 217 may be utilized to secure a loose tail of the web material associated with the second winding spindle 226 after the separation of the web material 212 by the web separator 234.

Figure 4:
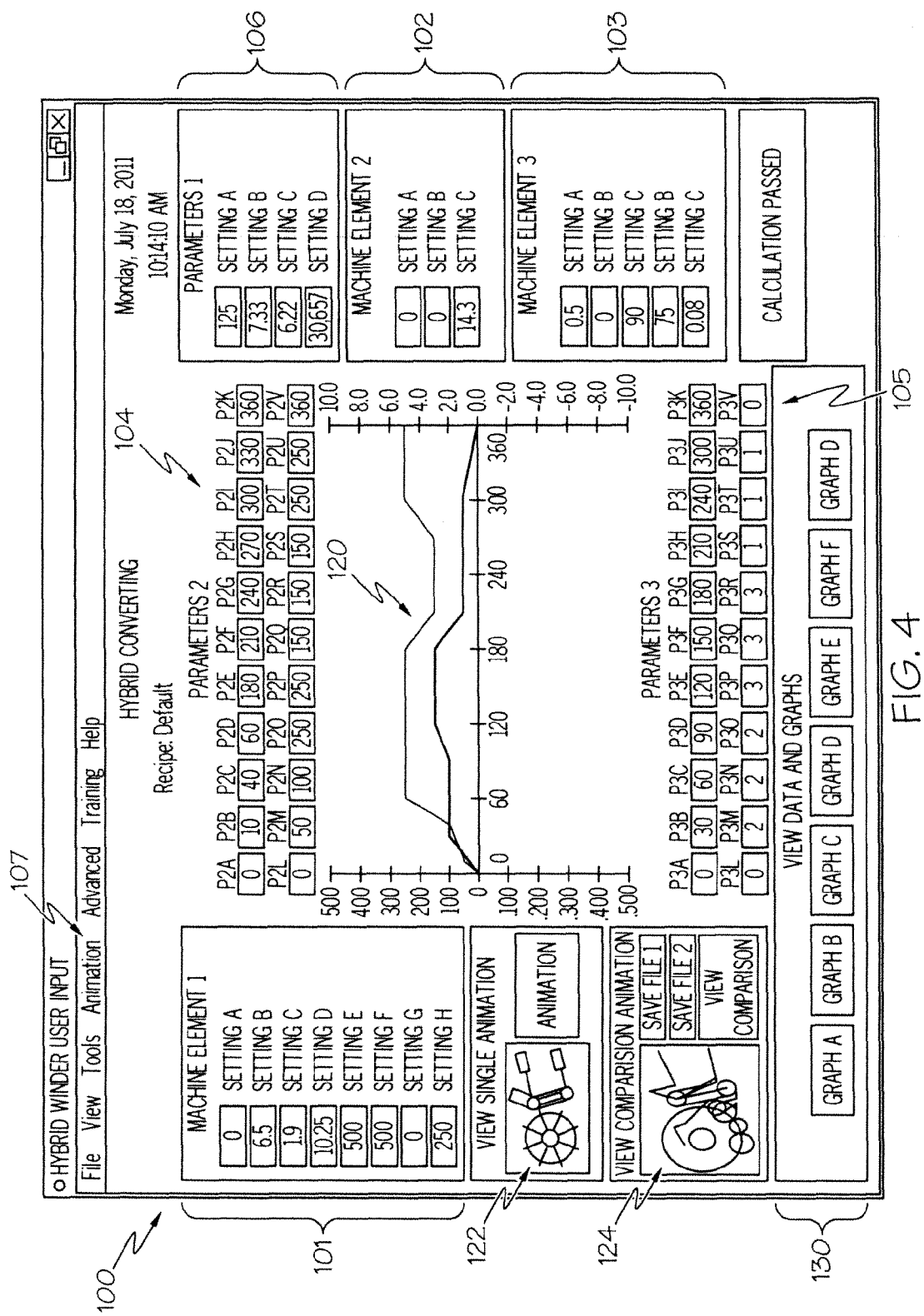
FIG. 4 schematically depicts a graphical user interface of an emulator computer program product for emulating a machine according to one or more embodiments illustrated and described herein.

Referring now to FIG. 4, an exemplary graphical user interface 100 of an emulator computer program product for emulating a winder machine (i.e., "emulator") is illustrated. The graphical user interface 100 of the illustrated embodiment is for the winder machine that is schematically illustrated in FIG. 7A. As described above, the graphical user interface 100 may be generated and displayed by the computer device 12 or the human machine interface 20 illustrated in FIGS. 1-3. In one embodiment, a visual layout of the graphical user interface 100 of the emulator is substantially similar to the graphical user interface of the actual human machine interface 20 used to program and control the machine. In this manner, operators of the machine may feel comfortable operating the emulator, and real scenario training of operators may be facilitated.

Generally, the graphical user interface 100 of the emulator comprises a plurality of input fields 101-106 into which a user may enter or otherwise adjust parameters associated with mechanical elements and actuators of the machine, as well as product parameters desired of the finished, wound product. As an example and not a limitation, the emulator may be a VB.Net2010 application. Mechanical elements are defined herein as the mechanical components of the machine, such as belts, mandrels, turret, rods, etc., while actuators are defined herein as the components that provide motion to the machine, and may include, without limitation, servo motors, linear actuators, pneumatic actuators, and hydraulic actuators. An individual input field displayed by the graphical user interface 100 may correspond to a particular property of a mechanical component or actuator of the machine (e.g., size, length of travel, actuation speed, etc.). The input fields 101-106 displayed by the graphical user interface 100 may be the same input fields displayed by the human machine interface of the machine.

As an example and not a limitation, plurality of machine input fields 101-103 may correspond with hybrid winder machine element/actuator parameters, while plurality of product input fields 104 may correspond with various product parameters. The parameters associated with input fields 101-103 may correspond, for example, to elements such as the conveyor belt 216, first and second positioning actuators 252, 254, winding turret 220, web separator 234, etc.

More or fewer input fields may be provided depending on the particular application. It should be understood that the type of parameters and input fields will depend on the machine being emulated. For example, the parameters for a machine used to manufacture shoes will have different mechanical elements and actuators than a winder machine and therefore the graphical user interface face will display input fields.

Figure 5:
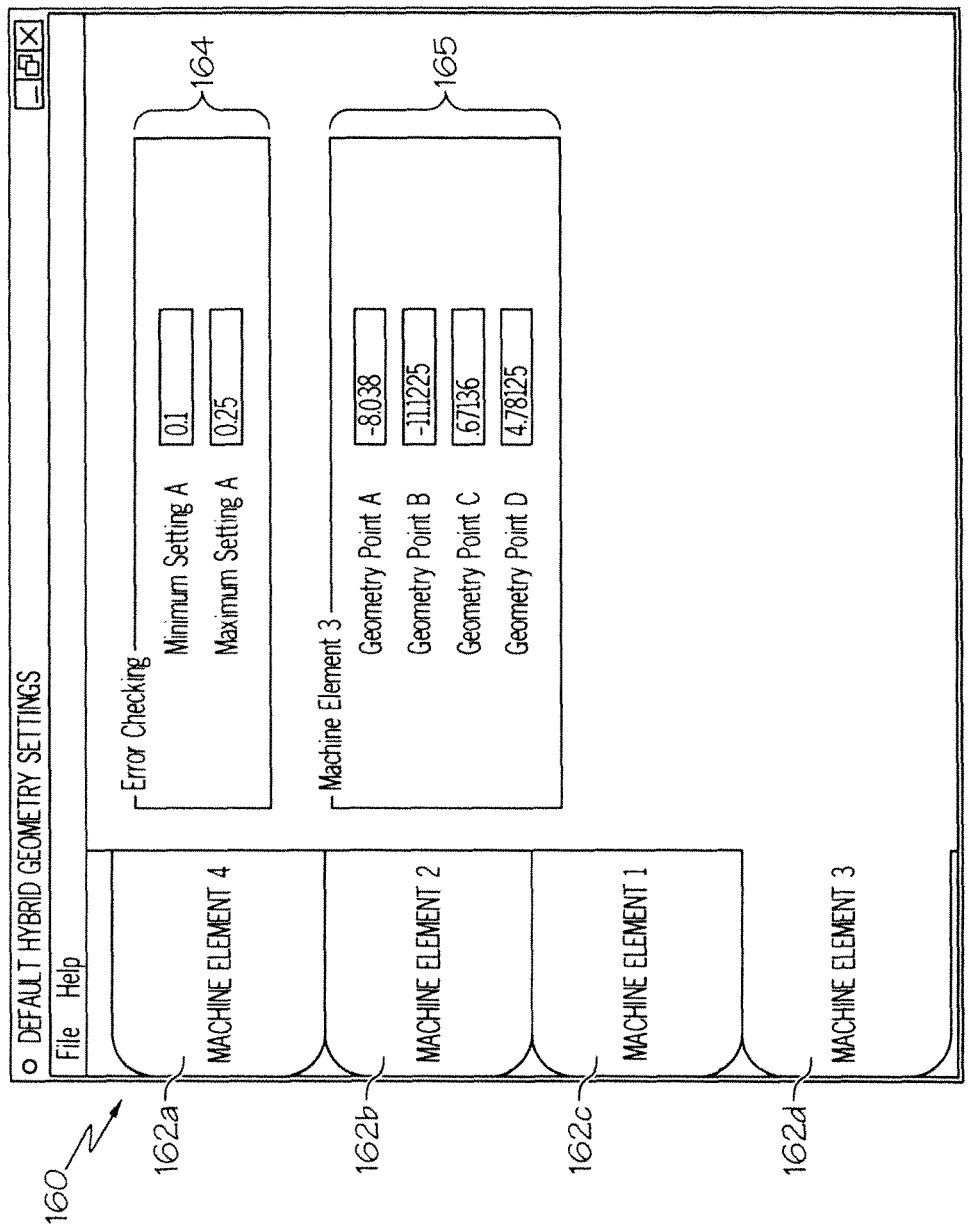
FIG. 5 schematically depicts a geometry settings form of a graphical user interface according to one or more embodiments illustrated and described herein.

In one embodiment, a user of the emulator may also define the geometric configurations of the various mechanical elements of the machine. As an example and not a limitation, a user may select an option from a menu bar 107 to display a geometry setting form such as the geometry settings form 160 depicted in FIG. 5. The user may enter dimensional parameters into the form into a plurality of input fields 164/165 of the geometry settings form 160. In the illustrated example, the geometry settings form 160 enables a user to enter parameters associated with a particular machine element associated with geometry tab 162d. Parameters for other machine elements may be entered by selected geometry tabs 162a-162c. In one embodiment, the geometry settings form includes error checking input fields 164 and machine element geometry input fields 165. The error checking input fields 164 may allow a user to enter belt actuator minimum and maximum parameters such that the emulator may generate error messages when the output response data for the belt actuator indicates that the belt actuator is below the minimum or above the maximum values entered into the error checking input fields 164. Similarly, the user may enter belt geometry parameters into the plurality of machine element geometry input fields 165 (e.g., machine element dimensions). The geometry settings form 160 may be used by the user (e.g., machine designer, operator, trainee, etc.) to make design changes to the machine to predict how the redesigned machine will perform without actually changing the physical machine.

Input fields 106 may correspond with parameters associated with the product. In the winder machine context, the product may be wound web material, such that the parameters associated with input fields 106 may be sheet length, roll diameter, etc.

The parameters inputted into the plurality of input fields 101-106 and the geometry settings form 160 may be received and used by calculation routine logic that mimics the actual programmable logic controller code of the programmable logic controller in detail to produce output response data such that the machine process is emulated. A user may alter one or more parameters to predict an output response of the machine without physically running or altering the machine. The calculation routine may allow for ease of future updates to the machine and may reduce the potential for errors in the code.

The calculation routine logic may be computer readable program code that has been translated from the programmable logic controller code and operable to run on a computer device. As an example and not a limitation, the calculation routine logic may be implemented in an event-driven programming language (e.g., Microsoft® Visual Basic, or similar languages) application. Programs of the programmable logic controller code may be translated into modules, and routines may be translated into subroutines and functions, within calculation routine logic of the emulator application. In some embodiments, other calculation software packages may be used to develop functions that are imported into the calculation routine logic (e.g. MATLAB-generated algorithms provided as a DLL file utilized by the calculation routine logic).

In one embodiment, the output response data produced by the calculation routine may be displayed in a graphical representation within the graphical user interface 100. The graphical representation of the output response data may come in a variety of forms. In one embodiment, as depicted in FIG. 4, the graphical representation may be in the form of a servo drive data chart 120 that displays servo drive data of one or more of the servo actuators of the machine. In one embodiment, the servo drive data chart 120 mimics an output from the programmable logic controller code used to control the machine. The graphical representation may provide graphs (as well as tables) of the actuators' position, velocity, acceleration, and jerk. The graphical user interface 100 may include a graphical representation selection area 130 having one or more selectable buttons to generate particular charts, graphs, tables, etc. In the illustrated embodiment, the graphical representation selection area 130 has an upper belt button to generate an upper belt chart, a lower belt button to generate a lower belt chart, a chopper roll button to generate a chopper roll chart, a tail pan button to generate a tail pan chart, a roll build button to generate a roll build chart, a turret button to generated a turret chart, and a mandrel button to generate a mandrel chart. By selecting one of these buttons within the graphical representation selection area 130, a user may cause a graph and/or table depicting output response data associated with the particular actuator (e.g., the upper belt, the lower belt, etc.).

Figure 6:
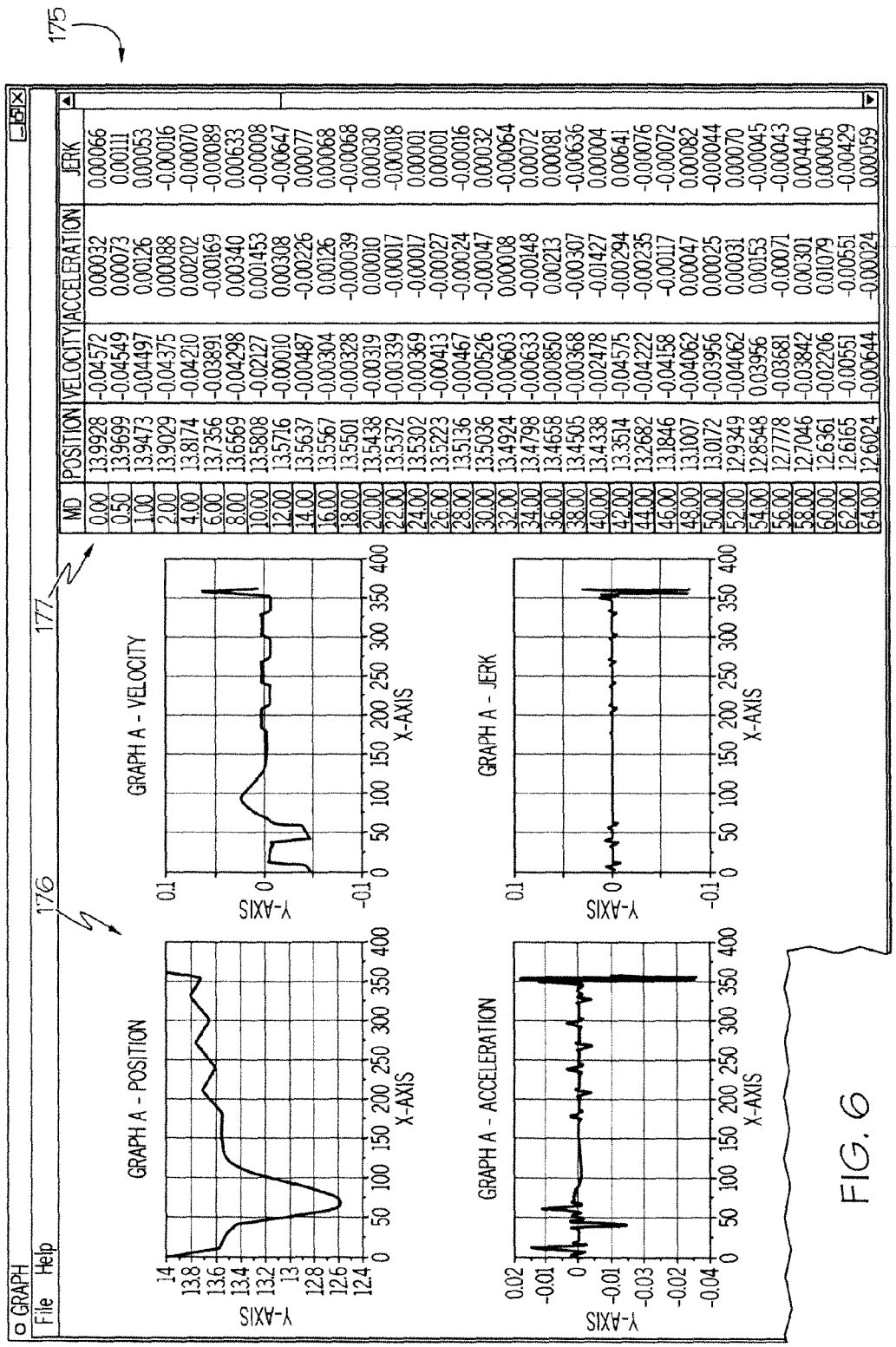
FIG. 6 depicts graphs and tables corresponding to output response data generated by a computer emulation of a machine according to one or more embodiments illustrated and described herein.

FIG. 6A depicts exemplary graphs and tables of output response data generated by the emulator with respect to the upper belt actuator. More specifically, FIG. 6A depicts four graphs 176 and four tables 177 relating to output response data in machine degrees for a particular mechanical element or actuator. As an example and not a limitation, the graphs 176 and tables 177 may correspond to element position, element velocity, element acceleration, and element jerk. The element may be any machine element or actuator (e.g., a machine belt). In one embodiment, the user may zoom or pan the graphs using an input device (e.g., a mouse or a touch screen). Further, in some embodiments the output response data generated by the calculation routine may be exported to a spreadsheet for further analysis.

Referring once again to FIG. 4, the graphical user interface 100 may include one or more animation buttons 122, 124 that cause an animation of at least one predicted machine operation to be displayed. In the illustrated embodiment, the graphical user interface 100 includes a "View Single Animation" button 122 and a "View Comparison Animation" button 124. Selection of the "View Single Animation" button 122 may cause an animation of a machine process corresponding output response data resulting from an emulation using the currently inputted parameters. FIG. 7A depicts a screen shot of an animation of a winder machine process. The animation may depict the movement of the mechanical elements of the machine over a range of machine degrees (e.g., 0 to 360 degrees). The animation may be based on the output response data produced by the calculation routine, and graphics elements associated with each of the mechanical elements and actuators. A graphics element provides a graphical representation of a mechanical element or an actuator within the animation. As an example and not a limitation, the animation may be an Adobe Flash-based executable file that provides continuous single-cycle animation. Other file formats may also be utilized. The animation may provide a visual indication to a user of changes made to the parameters inputted into the graphical user interface 100. A user may stop or start the animation by selecting the play/pause button 162, jump to a particular point in time of the animation using the scroll bar 260, change the speed using speed scroll bar 264, select a modeling mode using model mode selection 269 (e.g., select between a three-dimensionally rendered animation or a two-dimensionally rendered line animation, or select between one or more animations), and zoom in and out using zoom buttons 268. Other features may also be provided.

Figure 7B:
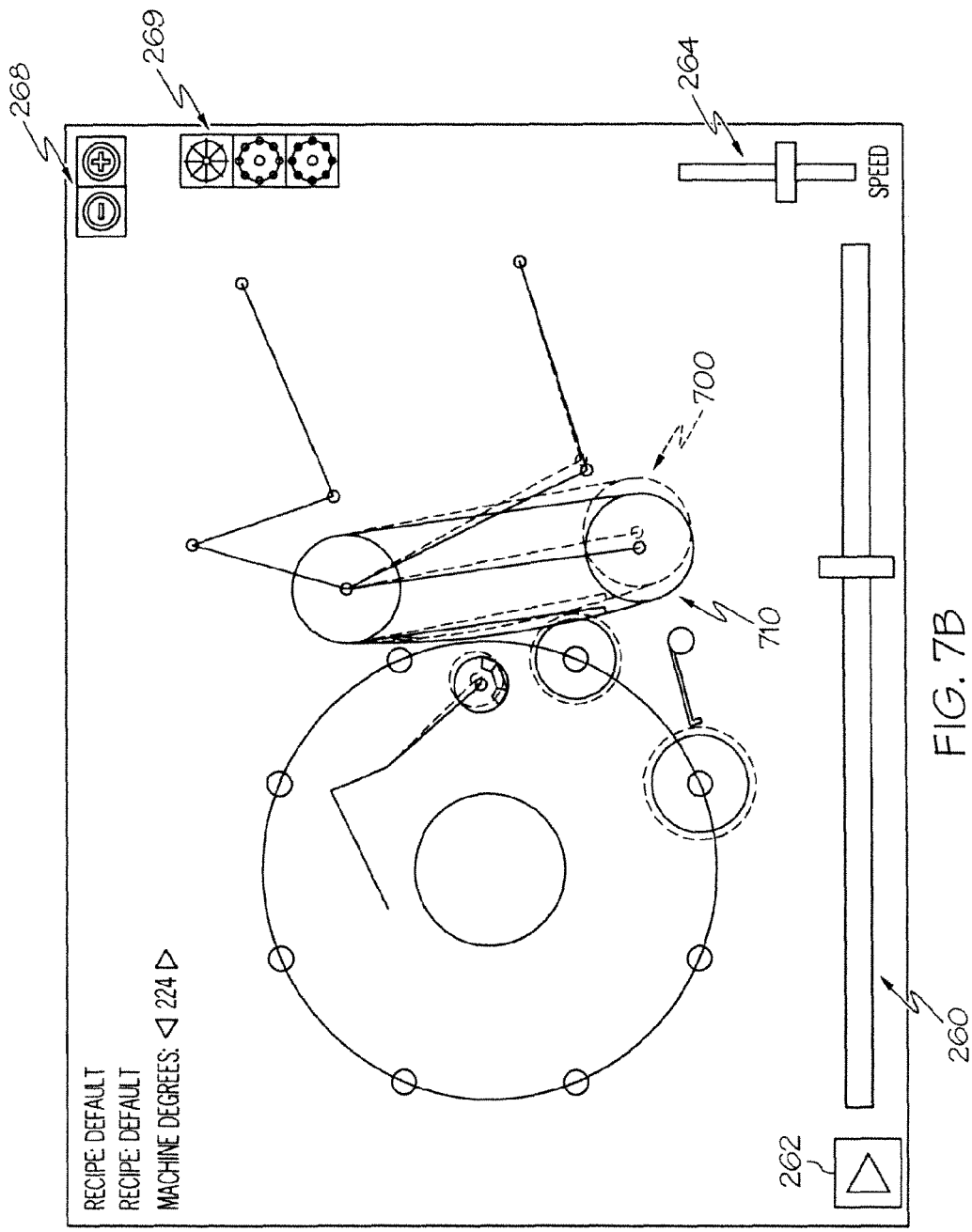

Selection of the "View Comparison Animation" button 124 may allow a user to select two (or more in some embodiments) previously saved files representing two different output response data sets for a comparison animation wherein two animations are overlaid with respect to one another. FIG. 7B depicts a screen shot of a comparison animation of two animations corresponding to two different output response data sets (e.g., a first machine animation 700 generated from a first plurality of parameters and a second machine animation 710 generated from a second plurality of parameters). For example, the output response data for the first machine animation 700 may have resulted from a first set of parameters, while the output response data for the second machine animation 710 may have resulted from a second set of parameters that is different from the first set of parameters. A user may then visualize the differences between the two animated machine processes and make adjustments to the parameters accordingly.

Figure 8:
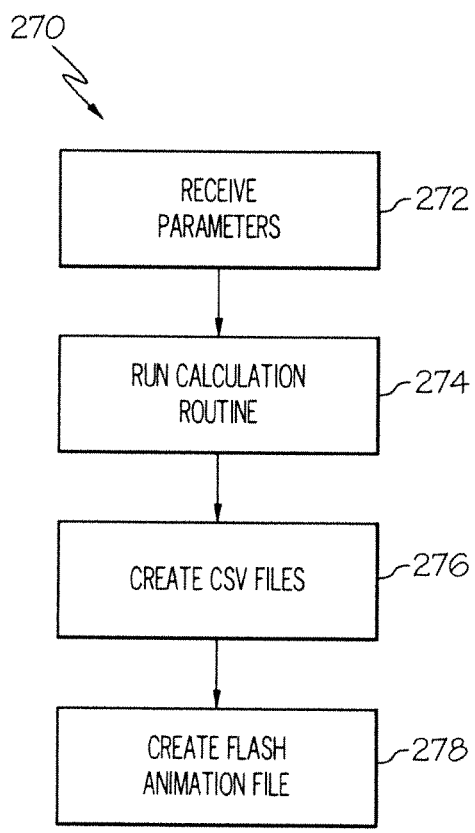
FIG. 8 depicts a flowchart of the process for generating an animation file of a machine animation according to one or more embodiments illustrated and described herein.

The animation file may be created in a variety of ways. FIG. 8 depicts a flowchart 270 of a process to create a Flash-based animation file. At block 272, the calculation routine logic 43 receives a plurality of parameters entered into the graphical user interface 100 as described above. Using the plurality of parameters, a calculation routine is executed to emulate the machine process and produce output response data at block 274. In response to a request for the display of one or more animation files, multiple comma-separated values files are generated at block 276. One comma-separated values file may list the geometry parameters entered into the geometry settings form 160 (i.e., a geometry settings comma-separated values file). Another comma-separated values file may list the output response data generated by the calculation routine in the form of position vs. time output data from one or more actuators (i.e., an output response comma-separated values file). A flash executable file pre-built with graphics elements that represent machine elements (i.e., cylinders, rods, etc.) may then be started and load the data from the comma-separated values files to display a continuous single cycle animation in block 278. In the comparison animation, an A set and a B set of comma-separated values files may be created that a Comparison Flash executable file loads into arrays and displays an overlaid output.

In an alternative embodiment, the emulator may generate and present still images representing the output response data based on different points in the emulated process rather than, or in addition to, an animation of the output response data. In this embodiment, a user may selectively view still images of the emulated process at desired points or times during the process. For example, the screen shots of the animations depicted in FIGS. 7A and 7B may be configured as still images rather than animations as described above.

In one embodiment, the emulator is configured to calculate and output programmable logic controller input values based on the parameters inputted into the graphical user interface 100 that may then be inputted into the programmable logic controller. For example, the emulator may produce a report that lists the programmable logic controller input values for each actuator based on the parameters that the user has entered into the graphical user interface 100. In this manner, a programmer or designer may easily enter the programmable logic controller input values generated by the emulator into the programmable logic controller. The emulator may also be configured to receive parameters inputted into the human machine interface from the programmable logic controller 28. For example, the graphical user interface 100 may be displayed within the human machine interface (e.g., the human machine interface 20 depicted in FIG. 2) so that a user may view an animation based on parameters or values entered into the programmable logic controller 28. In this manner, the operator of the machine may view not only the actual operation of the machine based on the parameters or values entered into the human machine interface, but also a detailed animation that may provide information that may not be readily apparent to the operator based on observing the machine alone.

Further, in another embodiment, the emulator may receive the actual output data of the programmable logic controller 28 (e.g., servo drive data) separate from, or in addition to, the parameters or values entered into the programmable logic controller 28 via the human machine interface. In this embodiment, the animation file is based on the actual output data (e.g., servo drive data or other drive data) of the programmable logic controller 28 rather than the output response data generated by the emulator. Therefore, the operator of the machine may view an animation that is based on the actual output data of the programmable logic controller 28.

Figure 9:
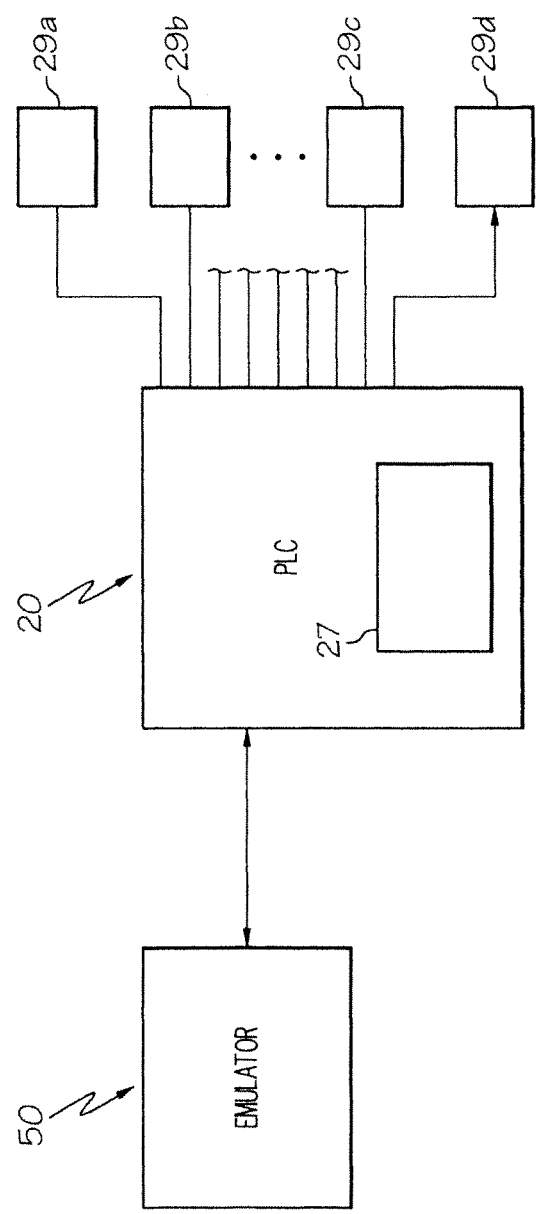
FIG. 9 schematically depicts an emulator linked to a programmable logic controller of a machine according to one or more embodiments illustrated and described herein.

FIG. 9 illustrates an embodiment wherein the emulator 50 is communicatively coupled to the programmable logic controller 28, which has machine computer readable medium 27 that store programmable logic controller code. As an example and not a limitation, the emulator 50 may be installed within the human machine interface 20 as depicted in FIG. 2. In this embodiment, a user of the emulator 50 may enter various parameters into the graphical user interface 100 displayed by the emulator and then output programmable logic controller values directly into the programmable logic controller 28. The programmable logic controller 28 may then send output signals to the various actuators 29a-29d. Communication between the emulator 50 and the programmable logic controller 28 may be effectuated by a variety of means. For example a commercially available object linking and embedding for process control (OPC) software package or dynamic data exchange (DDE) software package may be used to enable communication between the emulator 50 and the programmable logic controller 28. It should be understood that other methods of communication may be utilized, such a custom driver written for communication between the emulator 50 and the programmable logic controller 28, for example.

Figure 10A:
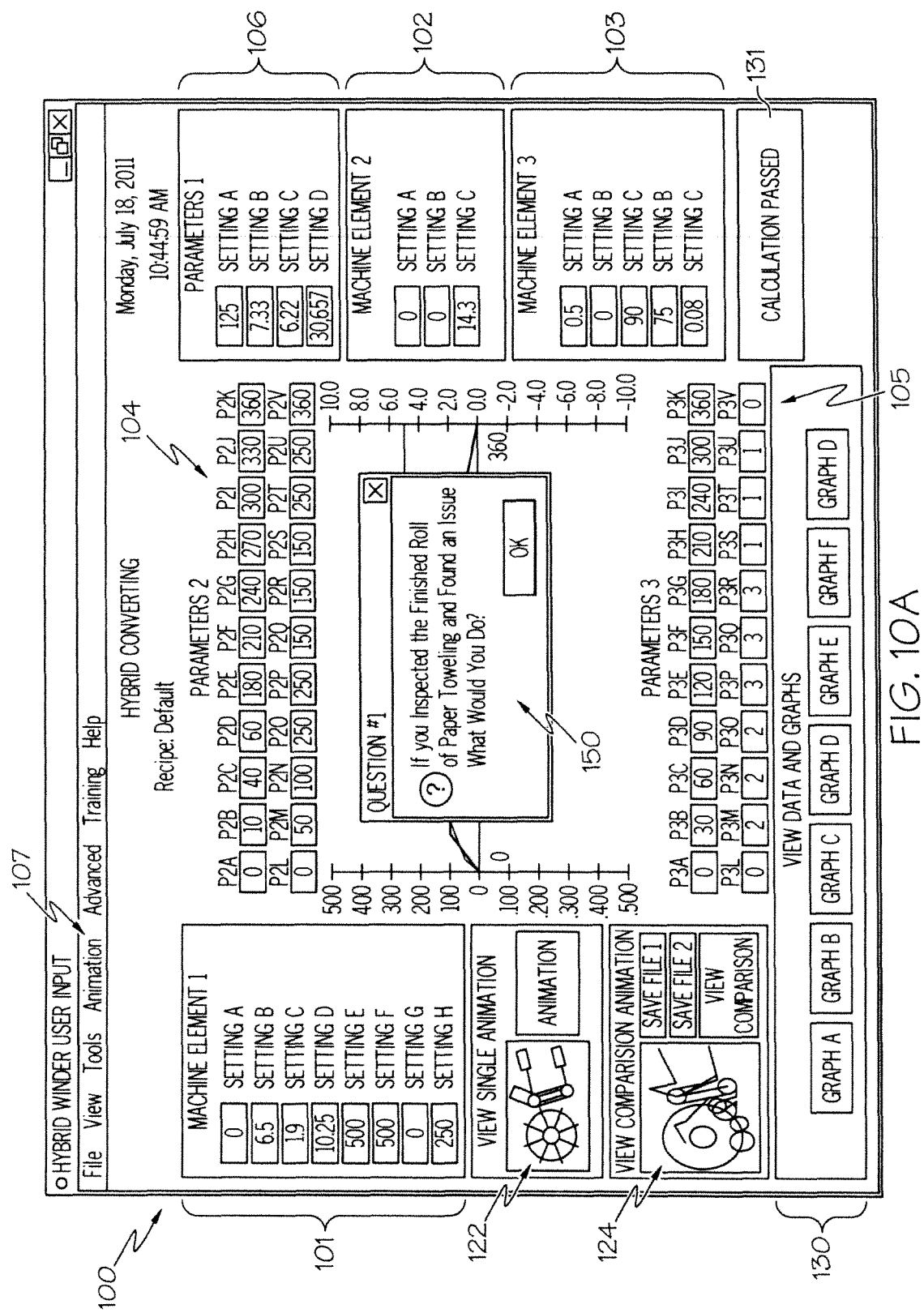

The emulator and its graphical user interface may also incorporate smart testing such that the emulator may be used as a training tool to train new operators of the machine. FIG. 10A depicts a graphical user interface 100 that displays a training scenario to the user via a pop-up training scenario message box 150. It should be understood that the training scenario may be presented in a manner other than a message box. The training scenario message box 150 may include text that describes a particular situation relating to the machine and prompts the user to make the appropriate parameter change(s) by inputting the correct parameter(s) into the correct corresponding input field(s). A feedback message (e.g., in a feedback message box) may be presented to the user in response to the inputted parameters. For example, the feedback message may indicate that the user entered to correct parameters, or the feedback message may indicate to the user that he or she is incorrect, and also indicate the correct parameters that the user should have entered in response to the training scenario. In this manner, the emulator may provide real-time feedback based upon the changes made by the user.

FIG. 10B illustrates a video training scenario message box 152 that includes a video display of an exemplary mechanical process of the machine that presents a question referring to a problem or issue. Similar to the training scenario message box 150 depicted in FIG. 10A, the video training scenario message box 152 prompts the user to make parameter changes, and will then provide feedback to the user based on his or her response. In this manner, the machine may be emulated while also displaying real-time feedback to the user.

In some embodiments, if a user does not answer a particular question correctly (either a text-based question or a video question), the emulator may be configured to ask the same question again at a later time during the same or a different training scenario, or it may be configured to ask the question in a different manner. As an example and not a limitation, the emulator may be configured to ask a user a text based question that corresponds to a video question that the user answered incorrectly.

Figure 11:
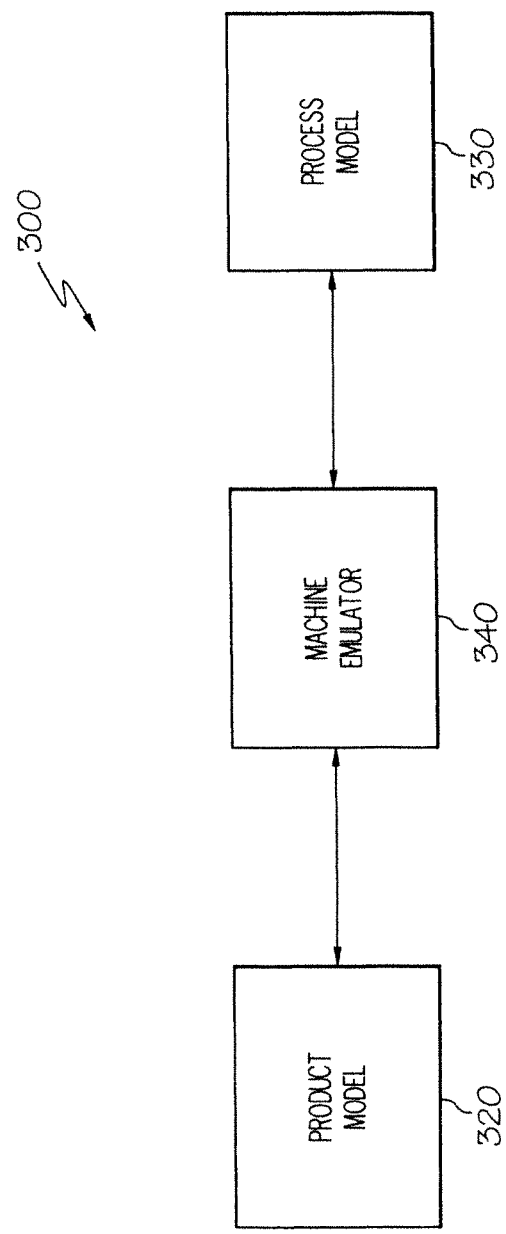
FIG. 11 schematically depicts a machine emulator computer program product linked to a product model and a process model according to one or more embodiments illustrated and described herein.

FIG. 11 illustrates a system wherein the machine emulator (e.g., emulator module 340) is also communicatively coupled to a product model 320 corresponding to the product manufactured by the machine and a process model 330 of the overall process used to manufacture the product. The emulator module 340 may be communicatively coupled to only the product model 320, only the process model 330, or both.

Linking the emulator module 340 to the product model 320 may allow the user to input product parameters as required by the product model and then, based upon the inputted process/equipment settings, the product implications could be displayed to the user within the graphical user interface. Similarly, linking the emulator module 340 to the process model 330 may allow the user to input product parameters as required by the process model and then based upon the inputted process/equipment settings, the process implications could be displayed to the user. Like the emulator module 340, the product model 320 and the process model 330 may be configured as computer readable program code, such as product model computer readable program code and process model computer readable program code, respectively. The emulator module 340, the product model 320 and the process model 330 may all be stored in a single memory component (i.e., a computer readable medium capable of storing computer readable instructions that are executable by a processor) of a single computer device (e.g., a personal computer, a server, the human machine interface, etc.). In another embodiment, the emulator module 340, the product model 320 and the process model 330 may be stored on separated memory components of separate computer devices.

Figure 12:
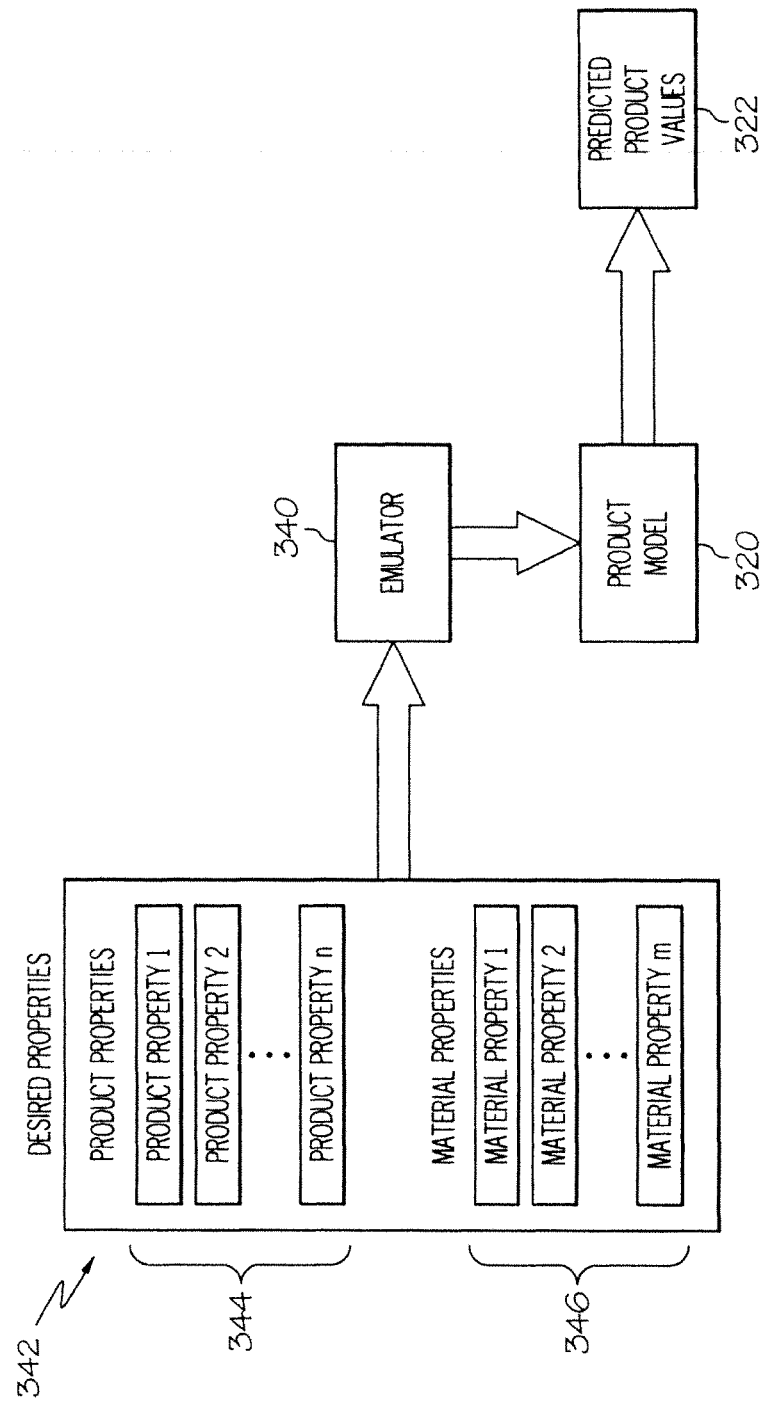
FIG. 12 schematically depicts a diagram illustrating a machine emulator linked to a product model according to one or more embodiments illustrated and described herein.

Referring now to FIG. 12, a system in which an emulator module 340 is linked to a product model 320 is illustrated. The product model may be configured as a mathematical model of a product that is generated in calculation software, such as, but not limited to, MathCAD, MATLAB, Excel, and the like. The product model 320 (e.g., a MathCAD model or a MATLAB model) may be configured to receive input parameters and calculate predicted product values 322 (i.e., transform input parameters into predicted product values). The product model 320 may be linked to the emulator module 340 such that the product model 320 receives inputted parameters from the emulator module 340 rather than from a user (although the product model 320 may be configured to receive inputted parameters from both the emulator module 340, a user, and other sources). In one embodiment, various desired product properties 342 (e.g., parameters corresponding to input fields 101-106 illustrated in FIG. 4) may be entered into the emulator module 340, as described above. The desired product properties may reflect desired characteristics of the finished product. Although the desired product properties 342 are shown as broken out into product properties 344 (e.g., sheet count, sheet length, etc.) and material properties 346 inputted into one or more material input fields of the graphical user interface (e.g., paper caliper, stretchability, etc.) embodiments are not limited thereto. For example, the machine process properties described above may also be inputted as the desired product properties. Any parameter described above with respect to the finished product and the overall process may be inputted.

After receiving the desired product properties 342, the emulator module 340 may calculate output response data, as described above. The output response data may include input parameters that are then provided to the product model 320. In one embodiment, some or all of the desired product properties 342 are also provided to the product model 320. The product model 320 may then utilize the provided input parameters from the emulator module 340 to calculate and output various predicted product values. In a wound web material product context, such as a paper towel roll, the various predicted product values 322 may include, but are not limited to, roll diameter value, perforation strength value, winding tension value, roll compressibility value, embossed depth value, etc. In this manner, a user may make changes to the desired product properties of the product and/or the process of the machine (e.g., actuator parameters, geometry parameters, etc.) using the emulator, and then predict various output properties of the finished product.

In one embodiment, the emulator module 340 may provide an option that generates a graphical representation of an anticipated product at any point during the process based on the parameters entered into the emulator module 340 and the parameters of the product model 360 (as well as the process model 360). The graphical representation of the anticipated product may include, but is not limited to, a three-dimensional illustration, a pictorial representation, or a CAD file. The graphical representation of the anticipated product may allow the user to see how the resulting product will look. For example, the emulator module 340 may be configured to present a user-selectable button that, when selected by a user, displays an illustration of what the finished product will look like. As non-limiting examples, the user may see if the appearance of the rolled product is flat, or if it has an uneven wind, etc. In an exemplary wrapper process, the graphical representation may show how much overlap is present, how well the ends are sealed, how firm or loose the wrapper material is on the roll, etc.

Figure 13:
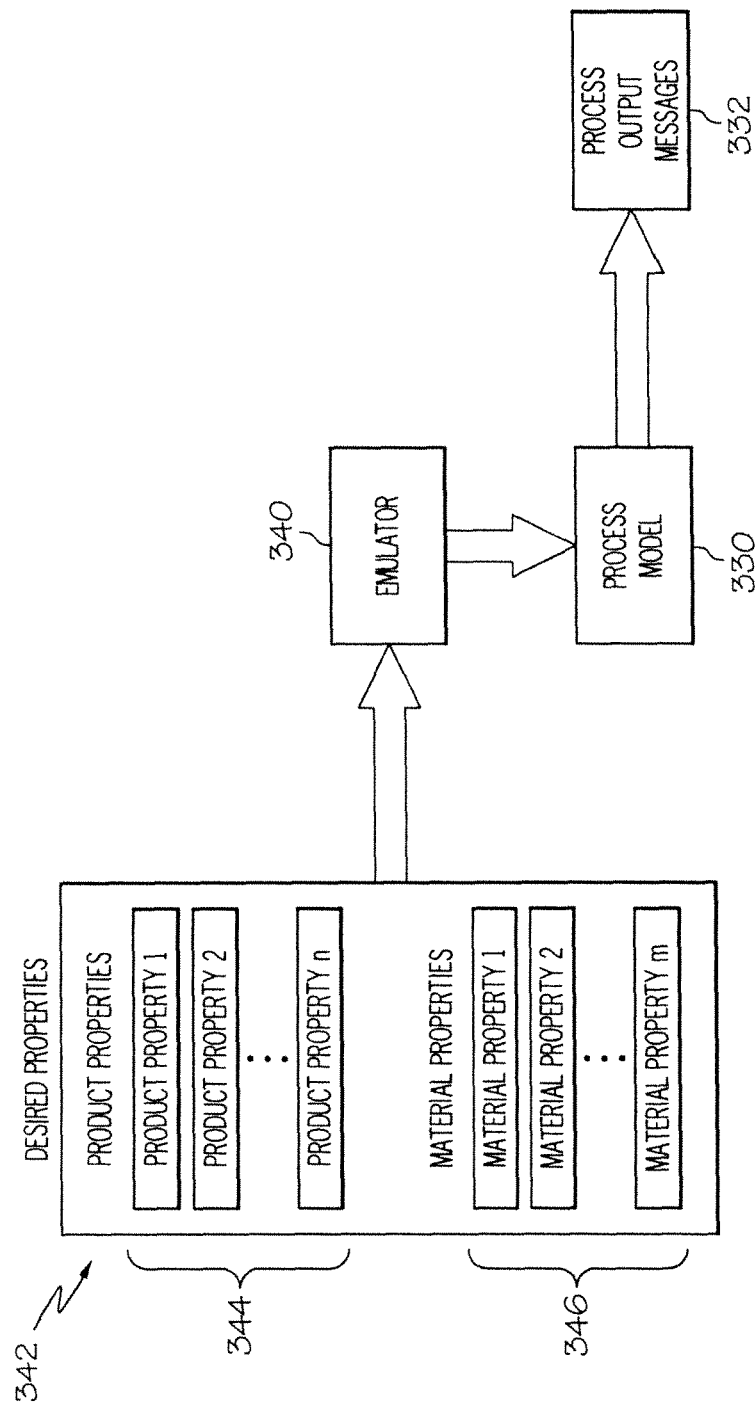
FIG. 13 schematically depicts a diagram illustrating a machine emulator linked to a process model according to one or more embodiments illustrated and described herein.

Referring now to FIG. 13, an embodiment in which the machine emulator module 340 is linked to a process model 360 is depicted. The process model 360 may be configured to predict how inputted parameters may affect the overall process of the machine, and to detect potential problems with the process based on the inputted parameters (i.e., transform input parameters into output messages indicative of the overall process of the machine). For example, the process model 360 may generate a process output message 362 that indicates to the user that particular inputted parameters may cause a predicted process of the machine to operate in a manner that is harmful to the machine and/or the manufactured product. The process model 360 may be programmed to recognize problems based on inputted parameters. Regarding machine process issues, a message may be generated in response to a particular combination of inputted parameters that indicates that the inputted parameters may cause the elements of the machine to wear quickly such that the process may be adversely affected over time. Other process output messages may indicate that the particular inputted parameters may cause the machine to operate in a manner that is outside of protocol. Regarding product issues, the process model may be configured to detect how inputted parameters may affect the overall process, and how the process may affect the finished product. For example, product model may indicate that inputted parameters may cause known problems, such as coning, breaking at the incorrect perforation, tail control, etc. The process model 360 may be programmed empirically, mathematically, or a combination of both.

As stated above with respect to the product model 320, the process model 360 may receive the inputted parameters from the output response data and/or desired product properties 342 (e.g., parameters corresponding to input fields 101-106 illustrated in FIG. 4) of the emulator module 340. In this manner, a user may make changes to the desired product properties provided to the emulator, and then predict how the desired product properties will affect the process of the machine.

One specific, non-limiting example of a process model linked to an emulator module is the prediction or modeling of how a web material behaves based on different input parameters, such as input parameters corresponding to different machine operations, mechanical elements, actuators, inertias, friction surfaces, and the like. The emulator module in conjunction with a process model may predict how stable the web material is, and how reliable a particular process is, based on changes in process and product parameters, particularly as the line speed of the hybrid winder machine increases. This model may incorporate parameters and predict based on physics how stable the process will be, what speed limitations might be reached, etc. Such web handling modeling may be utilized to develop better machine equipment. For example, in the hybrid winder context, better surface coatings for rollers may be developed, how to add or modify air foils may be determined, how to best change the draws between rolls may be developed, etc.

The emulator module 340 may be linked to both the product model 320 and the process model 360 simultaneously. The functionality of the product model 320, the process model 360, or both, may be integrated directly into the emulator module 340. In one embodiment, the emulator module 340, the product model 320, and the process model 360 are all components of the machine (or human machine interface), and may be accessed through the human machine interface. A user may then be able to not only control the machine, but also run simulations and make output predictions using the emulator and product/process model functionality.

Linking the emulator module 340 with a product model 320 and a process model 360 may enable the emulator module 340 to determine how the product, process, and machine will behave based on user inputted parameters (e.g., material properties, geometries, actuators, etc.) and independently make conclusions about how a particular process will run or react. The emulator module 340 may utilize output response data from past scenarios based on particular input parameters to predict ideal input parameters based on empirical modeling. In one embodiment, the emulator module 340 may have a smart mode that predicts parameter values based on past experience, which may ideally provide the most reliable process for a given set of parameters.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be understood to those skilled in the art that various other changes and modifications can be made without departing from the spirit and scope of the invention. It is therefore intended to cover in the appended claims all such changes and modifications that are within the scope of this invention.

What is claimed is:

1. A machine comprising:
    a plurality of actuators;
    a plurality of mechanical elements, wherein individual ones of the plurality of mechanical elements are coupled to individual ones of the plurality of actuators such that the plurality of actuators move the plurality of mechanical elements;
    a human machine interface comprising a machine graphics display device, the human machine interface configured to accept input parameters, wherein the machine graphics display device is operable to display the input parameters and output data;
    a programmable logic controller comprising a non-transitory machine computer usable medium having programmable logic controller code embodied thereon, wherein the programmable logic controller is communicatively coupled to the human machine interface, and the programmable logic controller code comprises computer readable code instructions configured to receive input parameters from the human machine interface and provide output signals to the plurality of actuators in accordance with the received input parameters; and,
    a computer device comprising a processor and a non-transitory computer usable medium having computer readable program code embodied on the non-transitory computer usable medium for emulating a process of the machine, the computer readable program code comprising:
        computer readable code instructions configured to display a graphical user interface comprising a plurality of input fields corresponding to the plurality of actuators and the plurality of mechanical elements, and a graphical representation of output response data of the machine using inputted parameters;
        computer readable code instructions for receiving a plurality of parameters inputted into the plurality of input fields, wherein the plurality of parameters are associated with the plurality of actuators and the plurality of mechanical elements;
        computer readable code instructions for emulating a mechanical operation of the machine using the plurality of parameters inputted into the plurality of input fields by simulating the programmable logic controller code, and generating the output response data based on an emulation of the mechanical operation of the machine, at least a portion of the output response data being correlated to a product model wherein the product model is a mathematical model configured to calculate one or more predicted product values based at least in part on the output response data provided to the product model; and,
        computer readable code instructions for converting the output response data into the graphical representation of output response data for display within the graphical user interface.

2. The machine of claim 1 further comprising a graphics display device, wherein the graphical user interface is displayed on the graphics display device.

3. The machine of claim 1 wherein the graphical user interface is displayed on the machine graphics display device.

4. The machine of claim 1 wherein the computer readable program code further comprises computer readable code instructions for displaying an animation that represents at least one predicted machine operation based at least in part on the output response data.

5. The machine of claim 4 wherein:
    the animation comprises a first machine animation based on first output response data corresponding with a first plurality of parameters, and a second machine animation based on second output response data corresponding with a second plurality of parameters; and,
    the first machine animation and the second machine animation are displayed within the graphical user interface concurrently such that the first machine animation and the second machine animation are overlaid with respect to one another.

6. The machine of claim 4 wherein the animation is generated by computer readable code instructions configured to:
    create a geometry settings comma-separated values file comprising the plurality of parameters associated with the plurality of actuators and the plurality of mechanical elements;
    create an output response comma-separated values file comprising position versus time output values for the plurality of actuators and the plurality of mechanical elements of the output response data;
    associate a graphics element to each of the individual ones of the plurality of actuators and each of the individual ones of the plurality of mechanical elements; and,
    create a single cycle animation using the output response comma-separated values file, the output response comma-separated values file, and graphics elements for each of the individual ones of the plurality of actuators and each of the individual ones of the plurality of mechanical elements.

7. The machine of claim 1 wherein the machine is a winder machine for winding a continuous web material or interleaved web segments into rolls.

8. The machine of claim 1 wherein the further comprising computer readable code instructions for converting the plurality of parameters associated with the plurality of actuators and the plurality of mechanical elements into programmable logic controller input parameters of the programmable logic controller.

9. The machine of claim 1 wherein:
the computer readable program code embodies an emulator module; and, the emulator module and the programmable logic controller are configured for two way communication of data.

10. A machine comprising:
a plurality of actuators;
a plurality of mechanical elements, wherein individual ones of the plurality of mechanical elements are coupled to individual ones of the plurality of actuators such that the plurality of actuators move the plurality of mechanical elements;
a human machine interface comprising a machine graphics display device, the human machine interface configured to accept input parameters, wherein the machine graphics display device is operable to display the input parameters and output data
a programmable logic controller comprising a non-transitory machine computer usable medium having programmable logic controller code embodied thereon, wherein the programmable logic controller is communicatively coupled to the human machine interface, and the programmable logic controller code comprises computer readable code instructions configured to receive input parameters from the human machine interface and provide output signals to the plurality of actuators in accordance with the received input parameters; and,
a computer device comprising a processor and a non-transitory computer usable medium having computer readable program code embodied on the non-transitory computer usable medium for emulating a process of the machine, the computer readable program code comprising:
computer readable code instructions configured to display a graphical user interface comprising a plurality of input fields corresponding to the plurality of actuators and the plurality of mechanical elements, and a graphical representation of output response data of the machine using inputted parameters;
computer readable code instructions for receiving a plurality of parameters inputted into the plurality of input fields, wherein the plurality of parameters are associated with the plurality of actuators and the plurality of mechanical elements;
computer readable code instructions for emulating a mechanical operation of the machine using the plurality of parameters inputted into the plurality of input fields by simulating the programmable logic controller code, and generating the output response data based on an emulation of the mechanical operation of the machine, at least a portion of the output response data being correlated to a process model wherein the process model is a mathematical model configured to calculate one or more predicted process values based at least in part on the output response data provided to the process model; and,
computer readable code instructions for converting the output response data into the graphical representation of output response data for display within the graphical user interface.

\* \* \* \* \*